(12) United States Patent
Ryu et al.

(10) Patent No.: US 12,210,066 B2
(45) Date of Patent: Jan. 28, 2025

(54) METHOD AND APPARATUS FOR DETECTING DEFECTS OF RECHARGEABLE BATTERY

(71) Applicant: Mintech Co., Ltd, Daejeon (KR)

(72) Inventors: Ji Heon Ryu, Siheung (KR); Seong Tae Yoo, Icheon (KR); Young Jin Hong, Daejeon (KR)

(73) Assignee: Mintech Co., Ltd, Daejeon (KR)

( * ) Notice: Subject to any disclaimer, the term of this patent is extended or adjusted under 35 U.S.C. 154(b) by 68 days.

(21) Appl. No.: 17/992,157

(22) Filed: Nov. 22, 2022

(65) Prior Publication Data

US 2023/0168308 A1  Jun. 1, 2023

(30) Foreign Application Priority Data

Nov. 30, 2021 (KR) .......................... 10-2021-0169480

(51) Int. Cl.
*G01R 31/389* (2019.01)
*G01R 31/367* (2019.01)
*H01M 10/48* (2006.01)

(52) U.S. Cl.
CPC ......... *G01R 31/389* (2019.01); *G01R 31/367* (2019.01); *H01M 10/48* (2013.01)

(58) Field of Classification Search
None
See application file for complete search history.

(56) References Cited

U.S. PATENT DOCUMENTS

2009/0096459 A1   4/2009  Yoneda et al.
2014/0218042 A1*  8/2014  Koba ................... G01R 31/367
                                              324/430

(Continued)

FOREIGN PATENT DOCUMENTS

GB        2532726 A      6/2016
JP     2000-030763 A     1/2000

(Continued)

OTHER PUBLICATIONS

Dinh Vinh Do et al., "Impedance Observer for a Li-Ion Battery Using Kalman Filter", IEEE Transactions on Vehicular Technology, vol. 58, No. 8, Oct. 2009, pp. 3930-3937.

*Primary Examiner* — Jas A Sanghera
(74) *Attorney, Agent, or Firm* — Young Basile Hanlon & MacFarlane, P.C.

(57) ABSTRACT

Detecting a defect in a rechargeable battery includes measuring an output signal by applying an input signal to the battery while modulating frequency, calculating an AC impedance according to the frequency and the output signal, Nyquist plotting the AC impedance and building an equivalent circuit model based on the plot, calculating a product of a charge transfer resistance and an electric double layer capacitance in the model as a time constant or calculating a slope of a straight line appearing in a low-frequency region in the plot, comparing the time constant with a predetermined time constant or comparing an absolute value of the calculated slope of the straight line with a predetermined slope absolute value, and determining the battery is defective when the time constant is less than the predetermined time constant or when the absolute value of the calculated slope is smaller than the predetermined slope absolute value.

12 Claims, 16 Drawing Sheets

(56) References Cited

U.S. PATENT DOCUMENTS

| | | | |
|---|---|---|---|
| 2016/0006030 A1* | 1/2016 | Saka | H01M 4/366 |
| | | | 429/61 |
| 2017/0219660 A1* | 8/2017 | Christensen | B60L 58/16 |
| 2018/0056809 A1 | 3/2018 | Uchida | |
| 2018/0196107 A1* | 7/2018 | Fleischer | G01R 31/367 |
| 2018/0321326 A1 | 11/2018 | Tanaka et al. | |
| 2019/0088943 A1* | 3/2019 | Kato | H01M 4/131 |
| 2022/0032611 A1 | 2/2022 | Jung et al. | |
| 2022/0320611 A1 | 10/2022 | Mizuno et al. | |
| 2024/0044827 A1* | 2/2024 | Ishigaki | H01M 10/42 |

FOREIGN PATENT DOCUMENTS

| | | |
|---|---|---|
| JP | 2003-045500 A | 2/2003 |
| JP | 2003-317810 A | 11/2003 |
| JP | 2007-265894 A | 10/2007 |
| JP | 2014-206442 A | 10/2014 |
| JP | 2021-174729 A | 11/2021 |
| KR | 20110105047 A | 9/2011 |
| WO | 2021/028707 A1 | 2/2021 |

* cited by examiner

METHOD AND APPARATUS FOR DETECTING DEFECTS OF RECHARGEABLE BATTERY

CROSS-REFERENCE TO RELATED APPLICATION

This application claims priority to KR Application No. 10-2021-0169480, filed Nov. 30, 2021, which is incorporated herein in its entirety by reference.

TECHNICAL FIELD

The present disclosure relates to a method and apparatus for diagnosing a rechargeable battery, and more particularly, to a method of detecting a defect in a rechargeable battery using an AC impedance method and an apparatus to which the method is applied.

BACKGROUND

Interest in the increased price of energy sources due to the depletion of fossil fuels and in environmental pollution is increasing, and the demand for eco-friendly alternative energy sources is becoming an indispensable factor for future life. Accordingly, research on various power production technologies such as nuclear power, solar power, wind power, and tidal power is continuing, and there is also a great interest in power storage devices for using the generated energy more efficiently.

In particular, in the case of lithium rechargeable batteries, as the development and demand for mobile devices increase, the demand for the lithium rechargeable battery as an energy source is rapidly increasing. Recently, the use of the lithium rechargeable battery as a power source for electric vehicles (EV) and hybrid electric vehicles (HEV) has been realized, and the field of use of the lithium rechargeable battery is expanding for an electric power auxiliary power source through grid formation.

A lithium rechargeable battery used as a power source for electric vehicles and hybrid electric vehicles is required to have characteristics of high energy density and high output in a short time. Further, because the lithium rechargeable battery needs to be used for more than 10 years under harsh conditions where charging and discharging by large currents are repeated in a short time, the battery is inevitably required to have superior safety and long-term lifespan characteristics compared to the existing small-sized lithium rechargeable batteries.

In addition, lithium rechargeable batteries used as large-capacity power storage devices need to have high energy density, high efficiency, a long lifespan. It is particularly important to secure safety and reliability of the lithium rechargeable battery because firing or explosion upon a system's malfunction due to high performance and capacity increase may lead to large accidents.

During the manufacturing process of mass-producing rechargeable batteries, various deviations may occur between batteries, and internal short circuits may occur due to impurities mixed into raw materials and manufacturing process defects during the battery manufacturing process. The internal short circuit induces self-discharge to degrade the efficiency of the battery, which may cause a problem when the battery is used. However, above all, because the internal short circuit is a process in which the energy of the battery is converted into thermal energy, safety accidents such as heat generation and ignition may occur if an internal short circuit occurs or the internal short circuit expands during use. Therefore, it is essential to effectively detect a defective battery having these problems through a diagnostic test on the manufactured batteries before shipment.

Until now, as a method of detecting a battery having such an internal short circuit, there has been a method of determining a battery having a large degree of voltage drop as defective while maintaining the manufactured battery for 3 to 14 days. This is the most direct detection method because self-discharge occurs depending on the degree of internal short circuit. However, this method has problems in that a long time is required for detection and there is a limit in the screening ability.

SUMMARY

In view of the above, the present disclosure provides a method for detecting an internal short circuit occurring in a rechargeable battery based on a change in alternating current (AC) impedance, not self-discharge, and provides an apparatus in which the method is implemented. The AC impedance method is a method of analyzing the magnitude and phase difference of impedance by measuring the impedance according to the frequency while applying alternating current with a small amplitude at different frequencies, that is, a method of analyzing the characteristics of an electrochemical system based on the impedance of the electrochemical reaction depending on the AC frequency. This is called AC impedance or electrochemical impedance spectroscopy (EIS).

The objects to be achieved in the present disclosure are not limited to the objects mentioned above, and other objects not mentioned will be clearly understood by those of ordinary skill in the art to which the present disclosure belongs from the following description.

A method of detecting a defect in a rechargeable battery according to one embodiment of the present disclosure includes measuring an output signal by applying an input signal to a rechargeable battery while modulating a frequency and calculating an AC impedance according to a frequency from the input signal and the output signal, Nyquist plotting the calculated AC impedance and building an equivalent circuit model based on the Nyquist plot, calculating a product of a charge transfer resistance component $R_{ct}$ and an electric double layer capacitance component $C_{dl}$ in the equivalent circuit model as a time constant, comparing the time constant with a predetermined time constant, and determining the rechargeable battery as defective when the time constant is less than the predetermined time constant.

A method of detecting a defect in a rechargeable battery according to another embodiment of the present disclosure includes measuring an output signal by applying an input signal to a rechargeable battery while modulating a frequency and calculating an AC impedance according to a frequency from the input signal and the output signal, Nyquist plotting the calculated AC impedance and building an equivalent circuit model based on the Nyquist plot, calculating a slope of a straight line appearing in a low-frequency region in the Nyquist plot, comparing an absolute value of the calculated slope of the straight line with a predetermined slope absolute value, and determining the rechargeable battery as defective when the absolute value of the calculated slope of the straight line is smaller than the predetermined slope absolute value.

In a method of detecting a defect in a rechargeable battery according to still another embodiment of the present disclosure, after an AC voltage is used as the input signal and an AC current is measured as the output signal, the AC impedance may be calculated by dividing the input signal by the output signal. Alternatively, after an AC current is used as the input signal and an AC voltage is measured as the output signal, the AC impedance may be calculated by dividing the output signal by the input signal.

In a method of detecting a defect in a rechargeable battery according to still another embodiment of the present disclosure, one of the following (a) to (d) may be used as the equivalent circuit model.

In the equivalent circuit model (a), an inductance L is connected in series with a resistance $R_S$ of a rechargeable battery electrolyte, which is connected in series with a series of RC parallel circuits 1 through n, where n is an integer. The RC parallel circuits include at least two parallel circuits comprising a film resistance $R_{f1}$ a film capacitance $C_{f1}$ for the RC parallel circuit 1, through a film resistance $R_{fn}$ and a film capacitance $C_{fn}$ for an RC parallel circuit n. Another RC parallel circuit comprising a charge transfer resistance $R_{ct}$ and an electric double layer capacitance $C_{dl}$ is connected in series with the series of RC parallel circuits and in series with a Warburg impedance $Z_w$.

The equivalent circuit model (b) is similar to the equivalent circuit model (a) in that it has the inductance L is connected in series with the resistance $R_S$ of the rechargeable battery electrolyte, which is connected in series with the series of RC parallel circuits 1 through n. The equivalent circuit model (b) is different in that the series of RC parallel circuits 1 through n is connected in series to an RC parallel circuit including the electric double layer capacitance $C_{dl}$ and a resistance comprising the charge transfer resistance $R_{ct}$ in series with the Warburg impedance $Z_w$.

The equivalent circuit model (c) is similar to the equivalent circuit model (a) in that it has the inductance L is connected in series with the resistance $R_S$ of the rechargeable battery electrolyte, which is connected in series with the series of RC parallel circuits 1 through n. Then, the series of RC parallel circuits 1 through n is connected in series with an RC parallel circuit comprising a charge transfer resistance $R_{ct(+)}$ and an electric double layer capacitance $C_{dl(+)}$ for a cathode portion, which is in turn connected in series with an RC parallel circuit comprising a charge transfer resistance $R_{ct(-)}$ and an electric double layer capacitance $C_{dl(-)}$ for an anode portion. The Warburg impedance $Z_w$ is connected in series with this latter RC parallel circuit.

The equivalent circuit model (d) is similar to the equivalent circuit model (a) in that it has the inductance L is connected in series with the resistance $R_S$ of the rechargeable battery electrolyte, which is connected in series with the series of RC parallel circuits 1 through n. The equivalent circuit model (d) is different in that the series of RC parallel circuits 1 through n is connected in series to an RC parallel circuit including the electric double layer capacitance $C_{dl(-)}$ and a resistance comprising the charge transfer resistance $R_{ct(-)}$ in series with a Warburg impedance $Z_{w(-)}$ for an anode portion, which in turn is connected in series to an RC parallel circuit including the electric double layer capacitance $C_{dl(+)}$ and a resistance comprising the charge transfer resistance $R_{ct(+)}$ in series with a Warburg impedance $Z_{w(+)}$ for a cathode portion.

In a method of detecting a defect in a rechargeable battery according to still another embodiment of the present disclosure, the equivalent circuit models (a) through (d) described above in which the inductance component L is omitted may be used.

In some implementations of the above equivalent circuit models, n=4.

In a method of detecting a defect in a rechargeable battery according to still another embodiment of the present disclosure, the slope of the straight line may be calculated in a low-frequency region in which the frequency is greater than 0 Hertz (Hz) and less than or equal to 1 Hz.

In a method of detecting a defect in a rechargeable battery according to still another embodiment of the present disclosure, the AC impedance may be calculated by setting an upper limit of a frequency modulation range of the input signal applied to the rechargeable battery to 10 Hz to 100 Mega-Hertz (MHZ) and setting a lower limit of the frequency modulation range to 0.05 Hz to 0.001 Hz.

In a method of detecting a defect in a rechargeable battery according to still another embodiment of the present disclosure, the AC impedance may be calculated by applying the input signal of which the frequency modulation range includes a range of 0.05 Hz to 1 Hz to the rechargeable battery.

In a method of detecting a defect in a rechargeable battery according to still another embodiment of the present disclosure, the AC impedance may be calculated in a range of state-of-charge (SOC) of 0% to 20%.

In a method of detecting a defect in a rechargeable battery according to still another embodiment of the present disclosure, the output signal may be open circuit voltage (OCV) upon the calculation of the AC impedance, and the AC impedance may be calculated in a range in which the OCV is 3.55 volts (V) or less.

In a method of detecting a defect in a rechargeable battery according to still another embodiment of the present disclosure, one or more of an internal short circuit due to metallic impurities mixed into a cathode material, an internal short circuit due to presence or particle separation of coarse particles in a cathode, an internal short circuit due to misalignment of an assembly position of a separator, folding of the separator, or pinholes in the separator, or an internal short circuit due to dendrites caused by lithium electrodeposition may be detected.

In a method of detecting a defect in a rechargeable battery according to still another embodiment of the present disclosure, the predetermined time constant may be determined by: measuring an output signal by applying an input signal to a standard rechargeable battery of the same standard as the rechargeable battery for which defects are to be detected while modulating a frequency and calculating an AC impedance according to a frequency from the input signal and the output signal, Nyquist plotting the calculated AC impedance and building an equivalent circuit model based on the Nyquist plot, and obtaining the product of a charge transfer resistance component $R_{ct}$ and an electric double layer capacitance component $C_{dl}$ in the equivalent circuit model.

In a method of detecting a defect in a rechargeable battery according to still another embodiment of the present disclosure, the predetermined time constant may be determined by preparing n (n being an integer of 2 or more) number of standard rechargeable batteries of the same standard as the rechargeable battery for which defects are to be detected, calculating a time constant for each standard rechargeable battery, and averaging the calculated n number of time constants.

In a method of detecting a defect in a rechargeable battery according to still another embodiment of the present disclosure, the predetermined slope may be predetermined by measuring an output signal by applying an input signal to the standard rechargeable battery of the same standard as the rechargeable battery for which defects are to be detected while modulating a frequency, calculating an AC impedance according to a frequency from the input signal and the output signal, Nyquist plotting the calculated AC impedance and building an equivalent circuit model based on the Nyquist plot, and calculating a slope of a straight line appearing in a low-frequency region in the Nyquist plot as the predetermined slope.

In a method of detecting a defect in a rechargeable battery according to still another embodiment of the present disclosure, the predetermined time constant may be determined by preparing n (n being an integer of 2 or more) number of standard rechargeable batteries of the same standard as the rechargeable battery for which defects are to be detected, calculating a slope of a straight line appearing in a low-frequency region in the Nyquist plot, for each of the standard rechargeable batteries, and averaging the calculated n number of slopes of the straight lines.

In a method of detecting a defect in a rechargeable battery according to still another embodiment of the present disclosure, the rechargeable battery defect may be determined in consideration of both the time constant and the slope of the straight line.

The method of detecting a defect in a rechargeable battery using an AC impedance method according to the present disclosure may be implemented in a rechargeable battery analysis apparatus, a charging/discharging apparatus for testing a rechargeable battery, and a rechargeable battery manufacturing apparatus.

The subject matter according to the present disclosure is not limited to those mentioned above, and other subject matter not mentioned may be clearly understood to those of ordinary skill in the art to which the present disclosure belongs from the following description.

According to various embodiments described herein, it is possible to quickly and accurately detect a rechargeable battery defect, in particular an internal short circuit, as compared to using a conventional voltage drop comparison method requiring a lengthy time period.

The effects to be achieved in the present disclosure are not limited to the above-mentioned effect, and other effects not mentioned will be clearly understood by those of ordinary skill in the art from the following description.

DETAILED DESCRIPTION

Figure 1A:
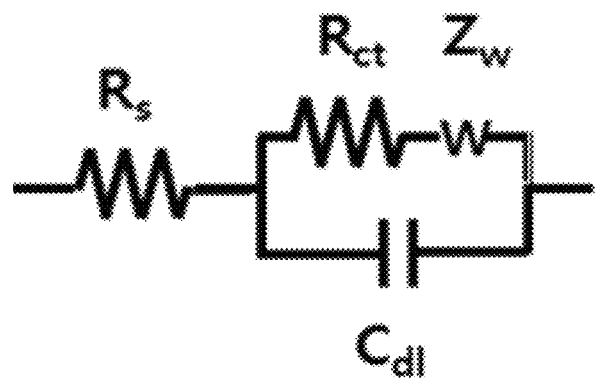
FIGS. 1A and 1B each show a Randles circuit modeling a rechargeable battery.

The terms used in this specification will be briefly described, and the present disclosure will be described in detail.

The terms used in this specification have been selected as currently widely used general terms as possible while considering their functions, but the terms may vary depending on the intention of a person skilled in the art, practice, the emergence of new technology, or the like. In addition, in a specific case, there are terms arbitrarily selected by the applicant, and in this case, the meaning thereof will be described in the corresponding description thereof. Therefore, the terms used in this specification should be interpreted based on the actual meaning of the terms and the contents of the entire specification, rather than the simple names of the terms.

Throughout the specification, when a part "comprises or includes" a certain component, it means that other components may be further included, rather than excluding other components, unless otherwise stated. In addition, terms such as " . . . unit" and "module" described in the specification mean a unit that processes at least one function or operation, which may be implemented as hardware or software, or a combination of hardware and software.

Hereinafter, embodiments of the present disclosure will be described in detail with reference to the accompanying drawings so that those of ordinary skill in the art can easily implement them. However, the present disclosure may be embodied in several different forms and is not limited to the embodiments described herein. Further, parts irrelevant to the description are omitted in the drawings to clearly explain the present disclosure, and similar reference numerals are given to similar parts throughout the specification unless otherwise stated.

Figure 1B:
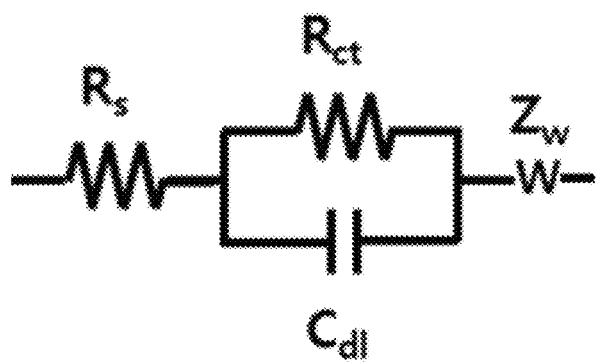

In general, a lithium ion battery is configured as a model based on a Randles circuit as shown in FIGS. 1A and 1B. Resistance $R_S$ is a resistance of the rechargeable battery electrolyte, Capacitance $C_{dl}$ indicates an electric double layer capacitance, Resistance $R_{ct}$ indicates a charge transfer resistance, and impedance $Z_w$ indicates a Warburg impedance.

The parallel connection circuit of resistance $R_{ct}$ and capacitance $C_{dl}$ shows the electron transfer reaction through the interface between the electrode and the electrolyte. Inside the rechargeable battery, the interface between the electrode and the electrolyte has a shape in which two layers of + charge and − charge face each other at a close distance. This is called electric double layer capacitance $C_{dl}$ and has characteristics similar to capacitance. If there is a potential difference between the electrode and the electrolyte in an equilibrium state, electric current flows. The potential difference in the equilibrium state is called overvoltage. The magnitude of the current is determined according to the magnitude of the overvoltage, and the correlation between the overvoltage and the current can be expressed by the Butler Volmer equation. From the correlation, the resistance that interferes with the movement of electrons between the electrode and the electrolyte can be obtained. This resistance is the charge transfer resistance $R_{ct}$.

A phenomenon in which molecules or ions move due to concentration differences because the concentration of substances is not uniform inside the rechargeable battery is called diffusion. The characteristics that mass transport prevents charge transfer due to the diffusion is called Warburg impedance $Z_w$, and it appears as a shape extending at an angle of −45 degrees with respect to the real axis in the impedance plot.

In the model of FIG. 1A, the capacitance $C_{dl}$ can be replaced with a constant phase element CPE (Q) due to the imperfection of the electrode. Further, in the construction of the equivalent circuit, it is also possible to move the impedance $Z_w$ from the parallel circuit to the series circuit, as shown in FIG. 1B.

Figure 2:
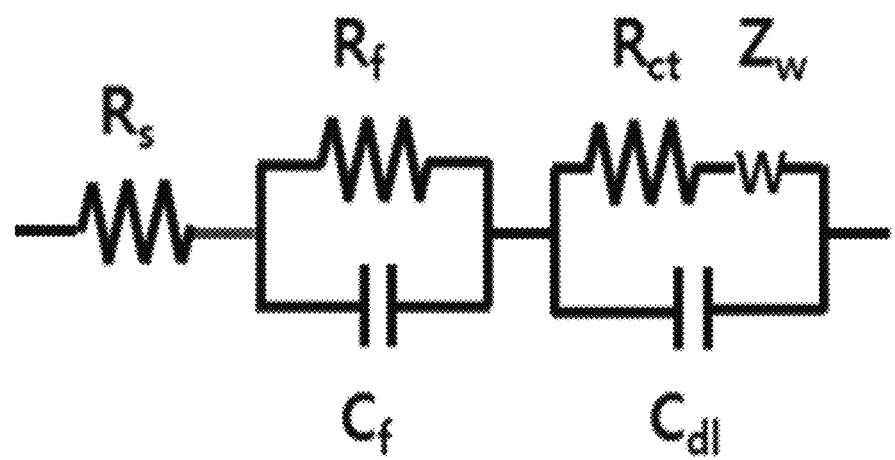
FIG. 2 shows the Randles circuit to which an RC parallel circuit for expressing film resistance or contact resistance is added.

In addition, in the case of a lithium rechargeable battery, because such a battery includes a process having a small time constant due to film resistance or contact resistance before charge transfer, as shown in FIG. 2, one or more resistance-capacitance (RC) parallel circuits may be added. As the number of added RC parallel circuits increases, the accuracy of the model increases, but there is a problem in that the calculation for fitting becomes complicated. Therefore, it is desirable to add four or fewer RC parallel circuits. In the present embodiment, the resistance $R_f$ represents film resistance, and the capacitance $C_f$ represents film capacitance.

Figure 3A:
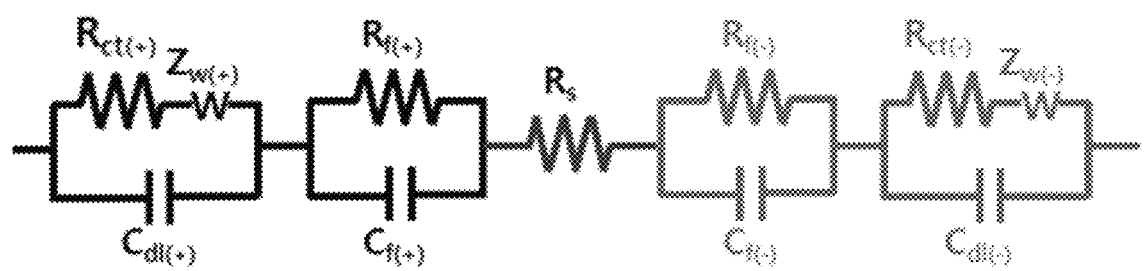
FIGS. 3A and 3B each show a full battery having a cathode half-cell portion and an anode half-cell portion.
Figure 3B:
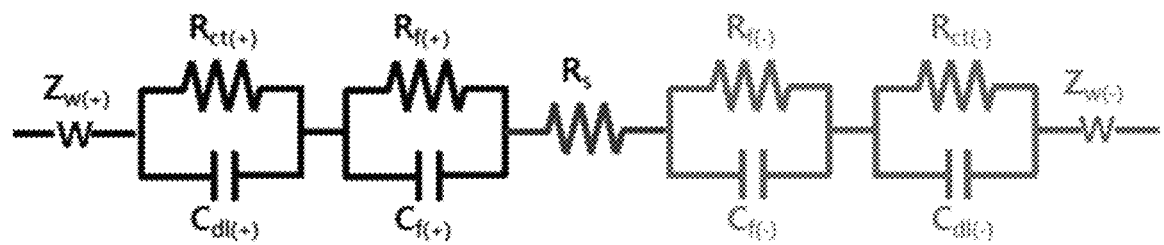

The rechargeable battery is basically composed of two electrodes, namely a cathode and an anode, so that the actual lithium-ion full battery has only one electrolyte resistance between the cathode and the anode. However, because the electrode reaction may occur in both the cathode and the anode, the battery can be expressed in the form as shown in FIG. 3A or FIG. 3B. In FIGS. 3A and 3B, the portion marked with (+) represents a half cell of the cathode portion, and the portion marked with (−) represents a half cell of the anode portion.

Figure 4A:
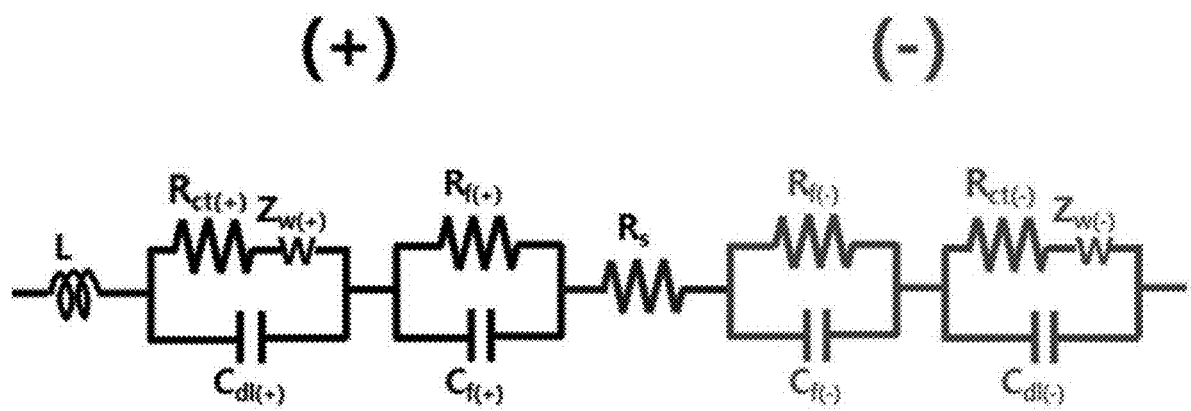
FIGS. 4A and 4B each show the full battery to which an inductance component appearing in a high-frequency region is added.
Figure 4B:
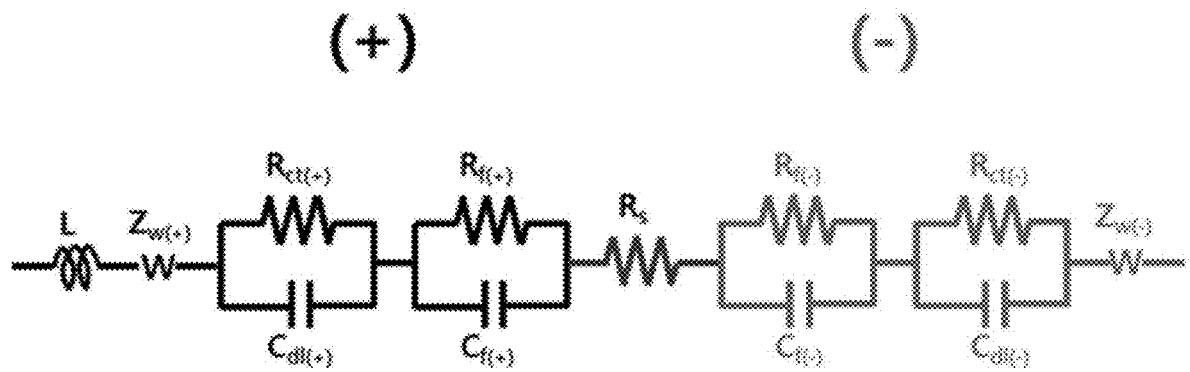

In addition, when measuring the AC impedance of the rechargeable battery, inductance may appear in the high-frequency region due to the influence of the conducting wire. To compensate for this, the equivalent circuit of the rechargeable battery may be configured to include inductance L as shown in FIG. 4A or FIG. 4B.

Figure 5A:
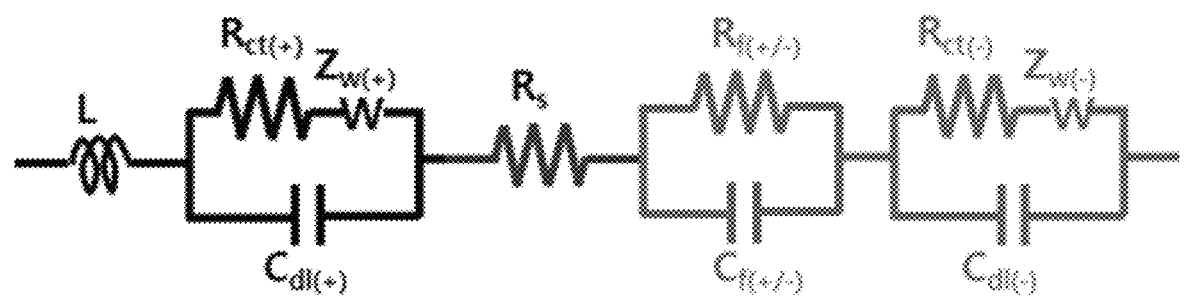
FIGS. 5A and 5B show a Randles circuit in which a film resistance component and a film capacitance component of an anode and a cathode are integrated into one RC circuit.
Figure 5B:
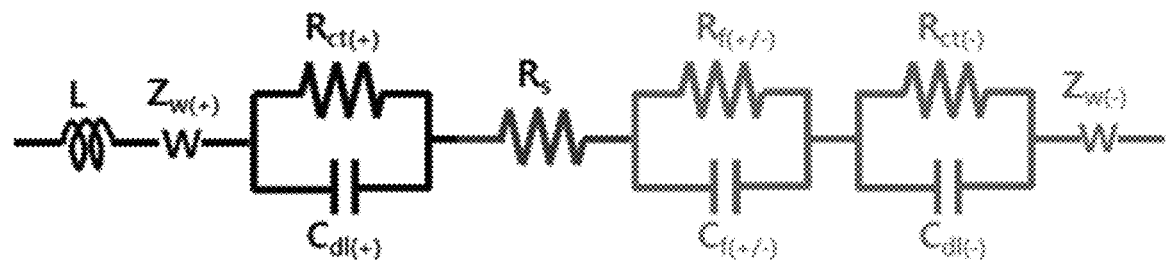

The rechargeable battery is basically composed of two electrodes, namely a cathode and an anode, so that the actual lithium-ion full battery has only one electrolyte resistance between the cathode and the anode. However, because the electrode reaction may occur in both electrodes, as shown in FIG. 5A or FIG. 5B, the battery can be expressed in the form in which the film resistance component and the film capacitance component of the cathode and the anode are integrated into one equivalent RC circuit.

Figure 6A:
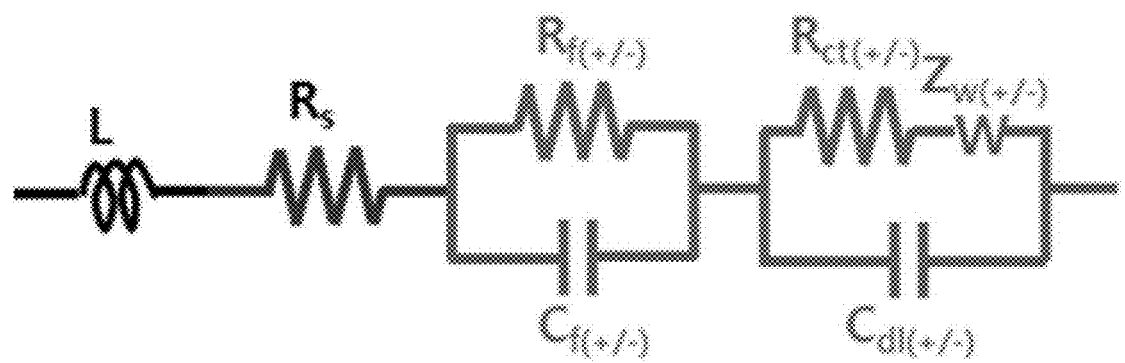
FIGS. 6A and 6B each show a Randles circuit in which film resistance portions, charge transfer portions, and Warburg portions are integrated in the cathode and the anode.
Figure 6B:
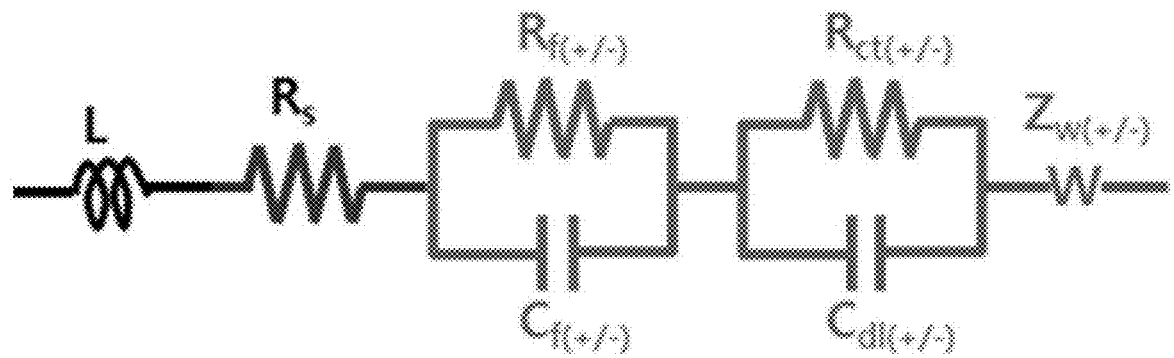

In practice, however, due to the similarity of the time constant of the cathode reaction and the time constant of the anode reaction, signals overlap each other between the film resistance portions, the charge transfer resistance portions, and the Warburg impedance portions, so that it becomes impossible to actually separate the signals in many cases. Therefore, it may be more accurate to separate the actual resistance factors and evaluate them individually, but it is also possible to, by integrating the film resistance portions, the charge transfer portions, and the Warburg impedance portions in the cathode portion and the anode portion, separate and evaluate them by characteristics. Therefore, this can also be expressed as the merged equivalent circuits shown in FIGS. 6A and 6B.

Figure 7:
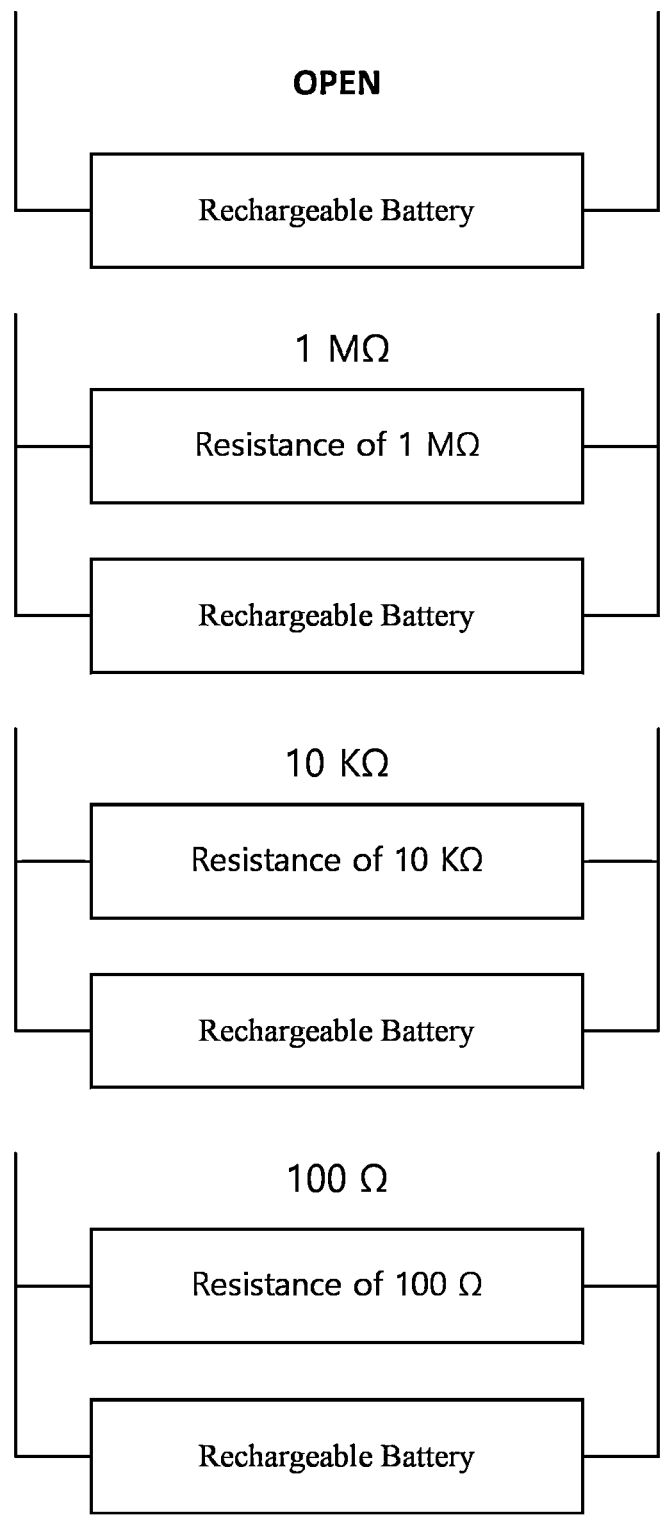
FIG. 7 shows a commercial lithium ion rechargeable battery for testing the degree of internal short circuit.

Based on the results of an AC impedance experiment of a lithium-ion full battery, a commercial rechargeable battery, the degree of change in the output value was simulated while increasing the degree of internal short circuit. As the level of the internal short circuit, as shown in FIG. 7, resistances of 1 Mega-Ohms (M (2), 10 kilo-Ohms (k (2), and 100 Ohms ($\Omega$) were respectively used at internal short circuit levels 1, 2, and 3, as shown in FIG. 7. For the simulation, ZView manufactured by Solartron Analytical company in the United Kingdom was used. The higher the level of short circuit (i.e., the higher the number of the level), the greater the degree of short circuit. The results are shown in FIG. 8 and analyzed by the equivalent circuit shown in FIG. 9.

Figure 8:
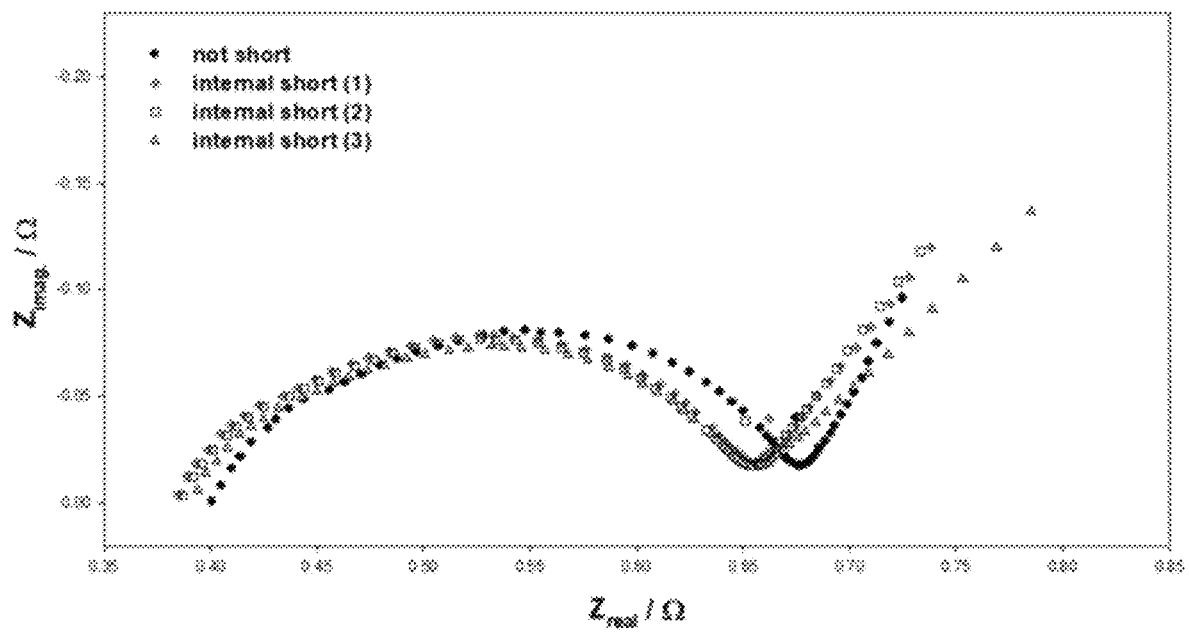
FIG. 8 shows simulation results performed while increasing the degree of internal short circuit for the commercial rechargeable battery shown in FIG. 7.

Referring to the simulation results shown in FIG. 8, the absolute value of the Warburg slope decreases in the low-frequency region due to ion diffusion in the solid, and the slope tends to be gentle. The result shown in FIG. 10 was obtained by calculating the slope in the Nyquist plot. As can be seen, as the slope became gentle as the level of internal short circuit increased, the absolute value of the negative slope decreased.

Figure 10:
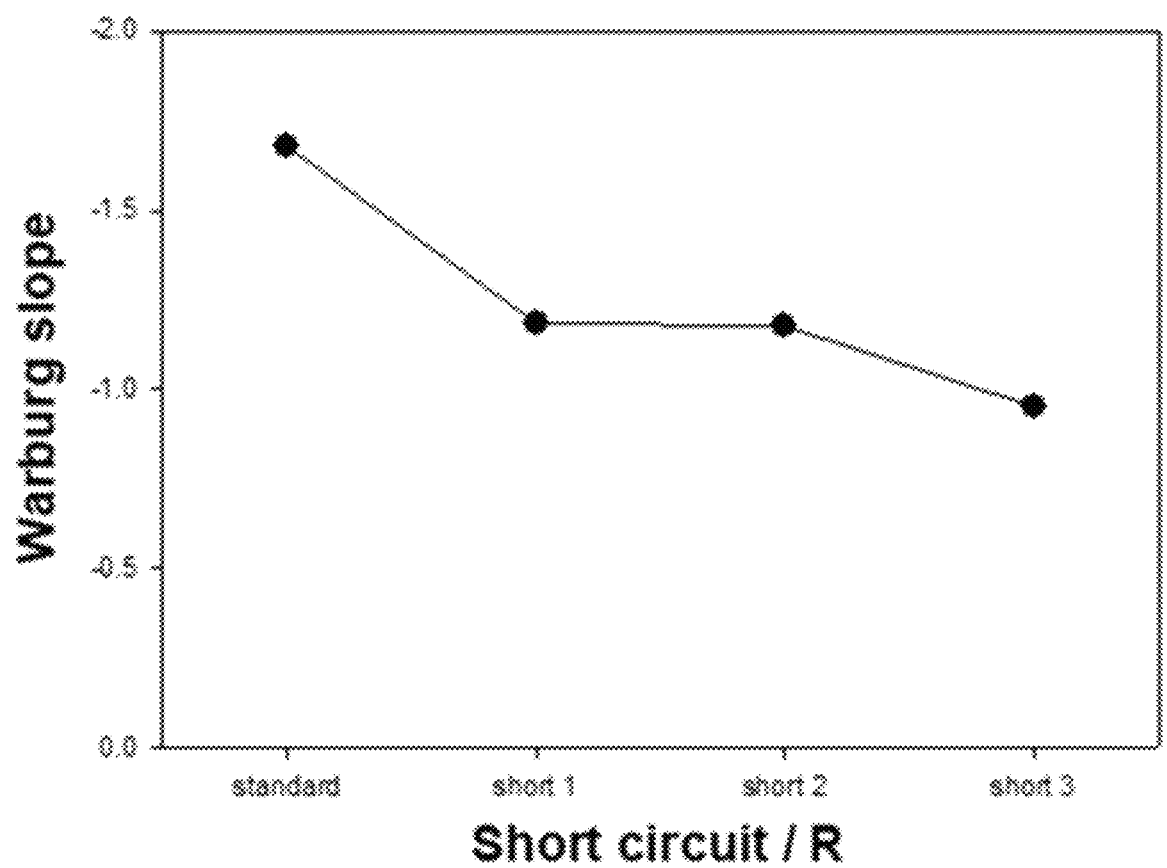
FIG. 10 shows the relationship between the degree of internal short circuit and a Warburg slope.

Specifically, as shown in FIG. 10, in the case of an open circuit, the absolute value of the Warburg slope in the low-frequency region is 1.677, and in the cases of the internal short circuit levels 1, 2, and 3, the absolute values of the Warburg slopes are 1.182, 1.178, and 0.949, respectively.

The Warburg slope in the low-frequency region may also be expressed by calculating the slope of the straight line in the low-frequency region from the AC impedance measurement result.

When analyzing the inside of a rechargeable battery from the AC impedance measurement result, the Warburg slope may change in the low-frequency region due to electrode imperfection and pore structure. If the frequency is being lowered for such electrochemical reaction, it is distinguished in the form of "Finite Space Warburg (FSW); Warburg open" or "Finite Length Warburg (FLW); Warburg short", and the behavior after the straight-line part varies depending on the characteristics of the electrochemical reaction, so fitting is performed using different functions. However, because measurements are usually used up to the straight-line part in the region to be measured, the analysis can be regarded as semi-infinite, and fitting can be performed using a function for a straight line. In this case, the continuous power-energy (CPE) function may be used for the fitting (e.g., for modeling Warburg) according to equation (1).

$$Z(CPE) = 1/Q_0(i\omega)^n \quad (1)$$

In the above and in the following, i=j and represents a unit imaginary number, and $\omega$ is an angular frequency.

If n=1, the AC impedance measurement result is pure capacitance.

If n=0, the AC impedance measurement result is pure resistance.

If n=½, the fitted line is a straight line of 45 degrees.

When fitting based on the above, among the three Warburg indexes $W_R$, $W_T$, and $W_P$, $W_P$=n and $W_T$=$Q_0$, so $W_P$ eventually shows the slope of the straight line in the low-frequency region. Here, index $W_P$ is an exponential factor, index $W_T$ is a diffusion analysis factor affected by the thickness and diffusion coefficient of the diffusion layer, and index $W_R$ is diffusion resistance (not used here in determining the Warburg slope).

According to another model to analyze Warburg, the Warburg impedance may be expressed by equation (2), where Aw is the Warburg coefficient or constant, and B is the Warburg open element (e.g., the square root of the diffusion time constant $\tau_D$, B=$\sqrt{\tau_D}$).

$$Z_W = \frac{A_W}{\sqrt{j\omega}} \tanh\left(B\sqrt{j\omega}\right) \quad (2)$$

Even in this equation, if there is a deviation from the ideal environment (e.g., n=½ does not represent 45 degrees), it is possible to fit such that the equation (3) is met.

$$(\sqrt{j\omega}) \rightarrow (j\omega)^n \rightarrow (j\omega)^{W_P} \quad (3)$$

This equation (3) is obtained by fitting $W_P$ beyond n=0.5 and results in a value indicating the magnitude of the slope according to equation (4).

$$\text{slope} = \tan\left(\frac{\pi}{2} \times n\right) = \tan\left(\frac{\pi}{2} \times W_P\right) \quad (4)$$

Therefore, the present inventor confirmed with simulation results and the above equations that the $W_P$ value is related to the slope of the straight-line part, the $W_P$ value decreases in proportion to the occurrence degree when an internal short circuit occurs, and the absolute value of the Warburg slope tends to decrease.

Figure 9:
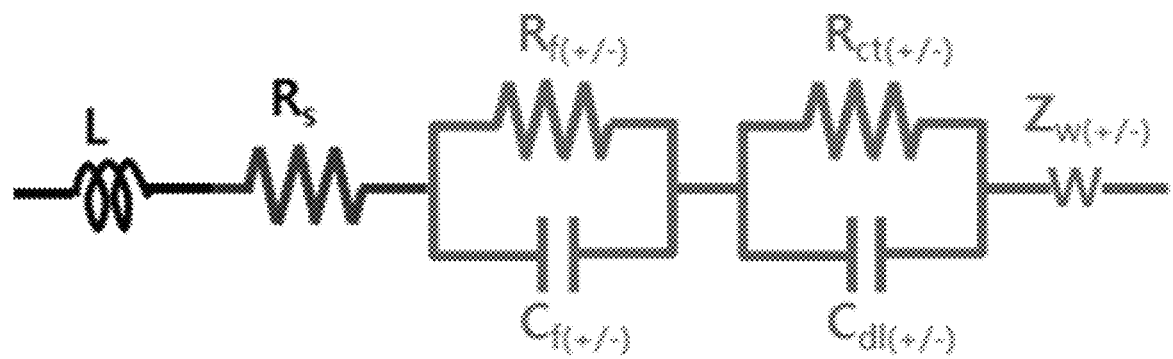
FIG. 9 is an equivalent circuit for analyzing the simulation results shown in FIG. 8.
Figure 11:
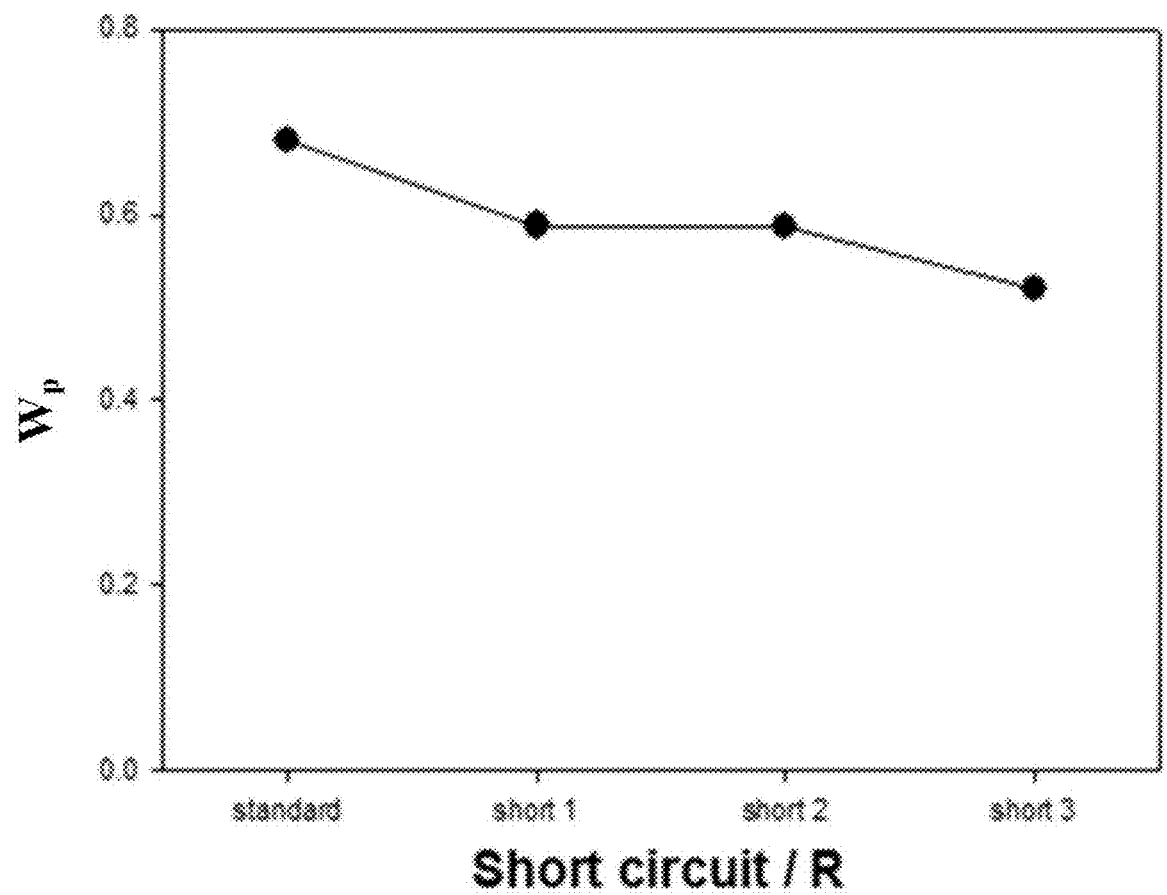
FIG. 11 shows the relationship between the degree of internal short circuit and a Warburg index WP value.

FIG. 11 shows a P value (the $W_P$ value) among the Warburg indexes obtained through a Complex Nonlinear Least Square (CNLS) fitting method based on the equivalent circuit shown in FIG. 9.

As shown in FIG. 11, the $W_P$ value showed a tendency to decrease as the short circuit level increased. Therefore, it can be interpreted that the Warburg slope in the low-frequency region becomes smoother as the level of the internal short circuit increases.

Figure 12:
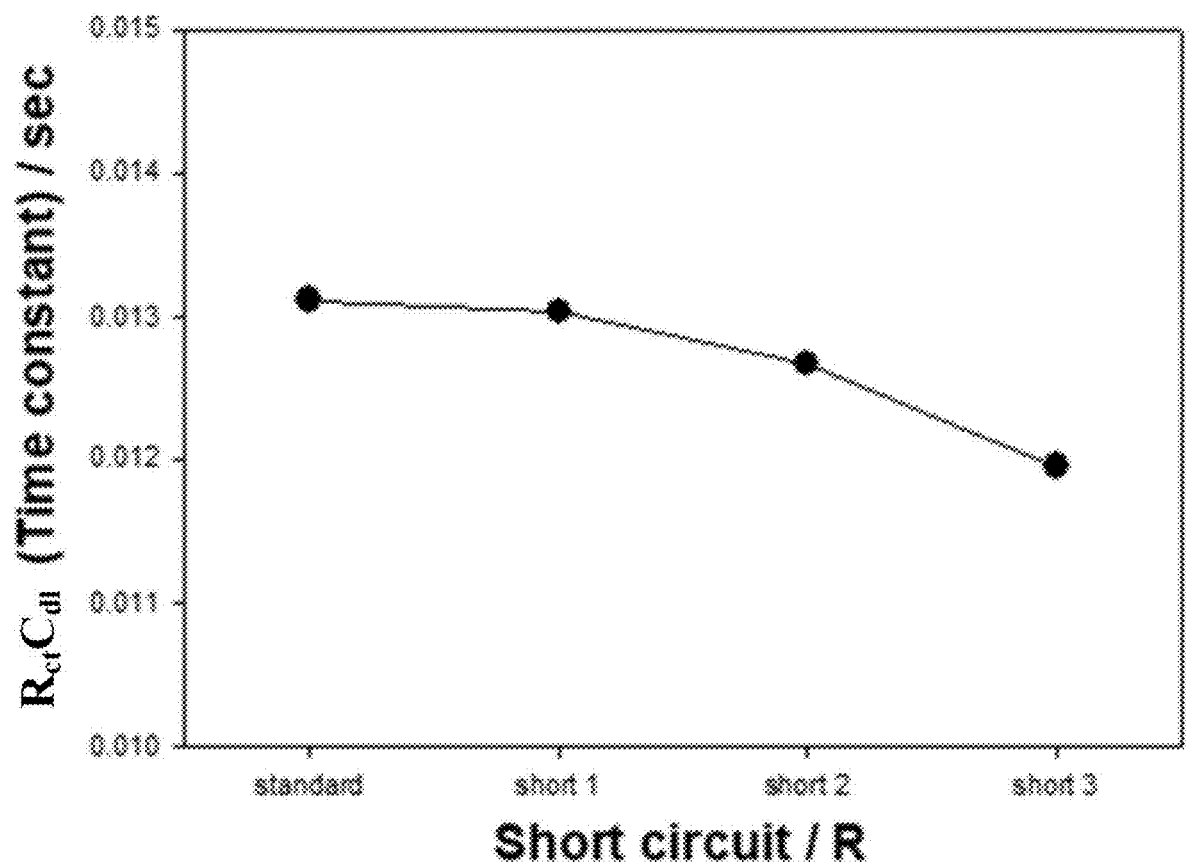
FIG. 12 shows the relationship between the degree of internal short circuit and a time constant (charge transfer resistance * electric double layer capacitance).

In fitting the simulation results shown in FIG. 8 to the circuit of FIG. 9, it has been confirmed that the time constant value t of a semicircle expressed as the product of the charge transfer resistance $R_{ct}$ and the electric double layer capacitance $C_{dl}$ is gradually decreasing as the level of internal short circuit increases. This change relationship is shown in FIG. 12.

Figure 13:
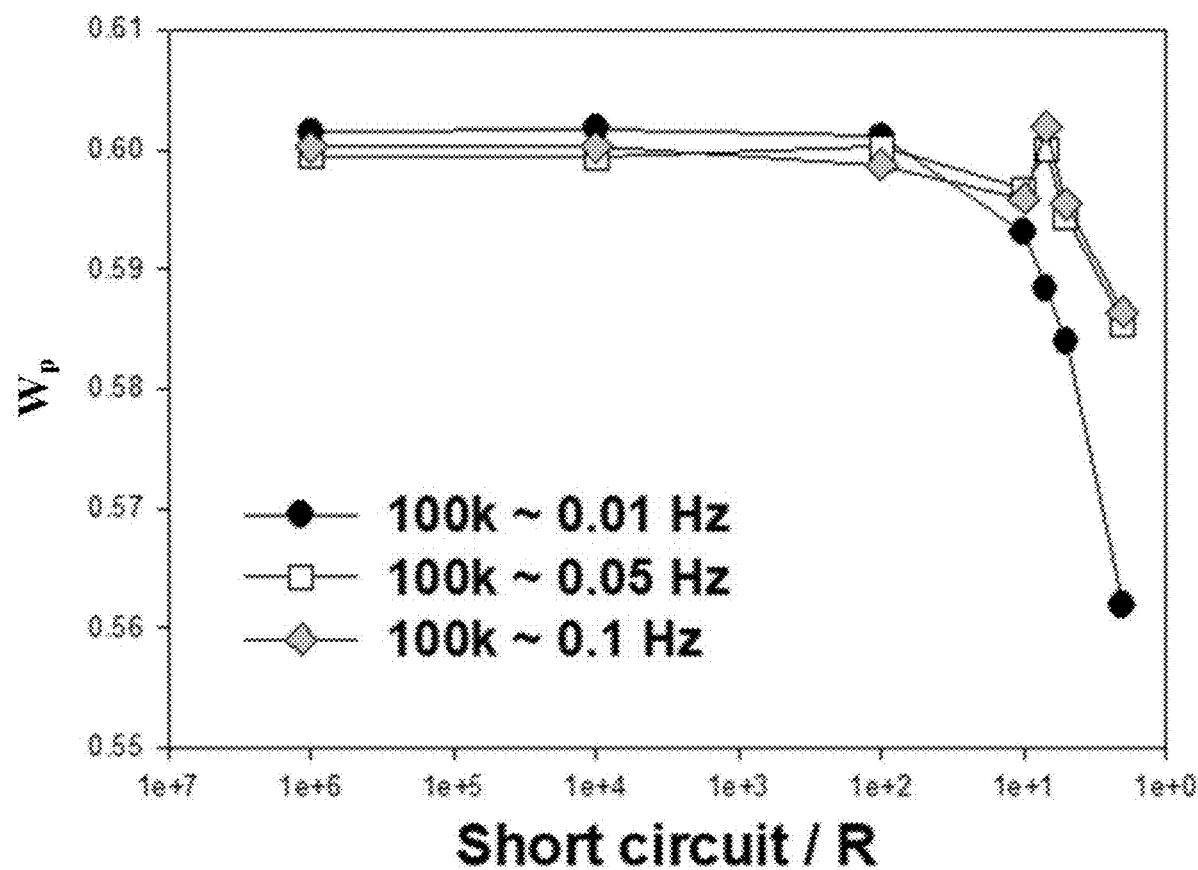
FIG. 13 shows the relationship between the degree of internal short circuit, the frequency region, and the Warburg index $W_P$ value.

In the method of measuring an internal short circuit based on Electrochemical Impedance Spectroscopy (EIS), the results were reviewed depending on the measurement frequency region. Because the criterion for discriminating an internal short circuit corresponds to the time constant for the charge transfer reaction and the Warburg slope, the change in the Warburg slope due to the internal short circuit is greater in the low-frequency region than in the high-frequency region. This dependence is shown in FIG. 13 as a relationship according to a change in frequency with the $W_P$ value on the vertical axis and the degree of internal short circuit on the horizontal axis.

As a result of measuring at room temperature, sufficient discrimination appears only in a frequency region of 0.05 Hz or less. Therefore, the internal short-circuit measurement method requires a frequency range of 10 MHz to 0.001 Hz. However, if the high-frequency region is too high, the price of the equipment may increase, and if the low-frequency region is too low, the measurement time may increase. Accordingly, 1 MHz to 0.002 Hz is preferable, and 100 kHz to 0.01 Hz is more preferable. When the low-frequency region exceeds 0.05 Hz, the selection ability is decreased (see 0.01 Hz and 0.05 Hz in FIG. 13).

As described above, in the method according to the present disclosure for measuring an internal short circuit based on EIS, the discrimination depending on a SOC was compared.

As a result of, after setting the SOC at various levels (e.g., 0%, 5%, 10%, 15%, 20%, 25%, 50%, 75%, 100%) and measuring the EIS, performing simulation and fitting based thereon, as the internal short circuit increased, both the time constant of charge transfer and the decrease in the absolute value of the Warburg slope showed the same pattern. This is shown in the Nyquist plot of FIG. 14, where the X-axis is a real impedance $Z_{real}$ and the Y-axis is an imaginary impedance $Z_{imag}$. To examine the discrimination of the internal short circuit, the relationship between the time constant and the internal short circuit depending on the SOC level is shown in FIG. 15A, and the relationship between the $W_P$ value and the internal short circuit depending on the SOC level is shown in FIG. 15B. In the discrimination of the internal short circuit, the discrimination appeared in the lower SOC side, and high discrimination was exhibited in the section where the SOC is less than 20%, and a further high discrimination was obtained in the section where the SOC is 0 to 10%. Therefore, the measurement SOC for defect detection is preferably in the range of 0 to 20%.

Further, the EIS measurement voltage (i.e., Open Circuit Voltage (OCV)) changes depending on SOC, such that SOC 20%, SOC 15%, SOC 10%, SOC 5%, and SOC 0% correspond to 3.55V, 3.51V, 3.48V, 3.46V, and 3.39V, respectively. Therefore, it is preferable that the OCV reference voltage is less than 3.55 V when measuring EIS for defect detection.

Figure 14:
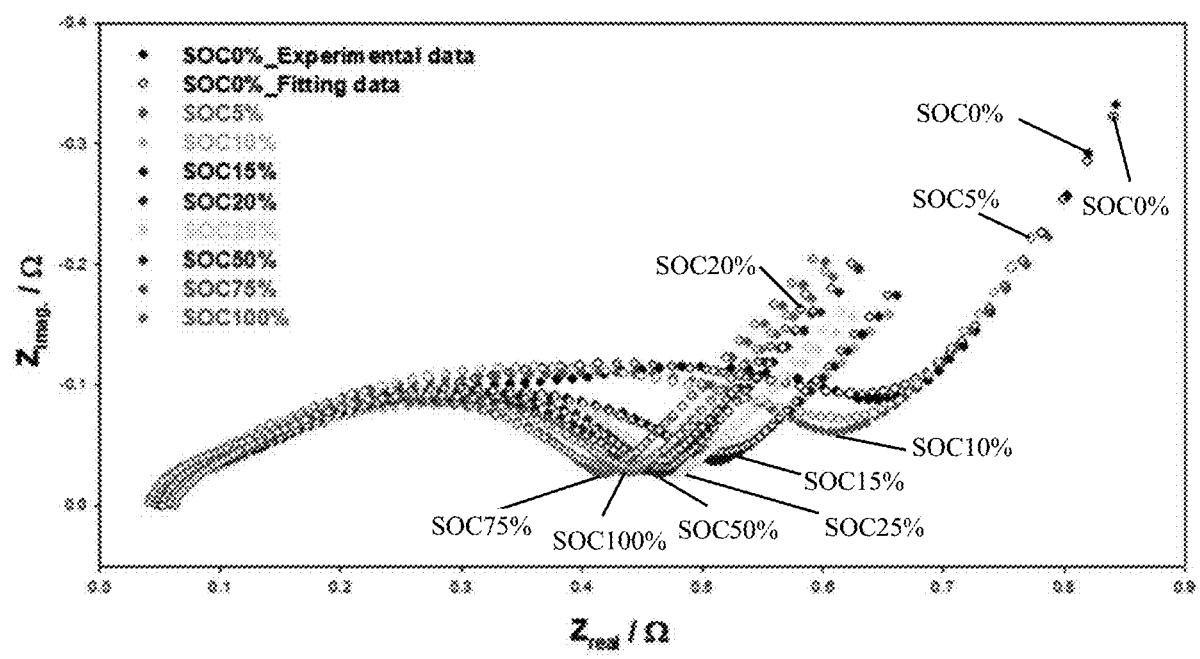
FIG. 14 is a Nyquist plot according to the degree of internal short circuit and a SOC level.
Figure 15A:
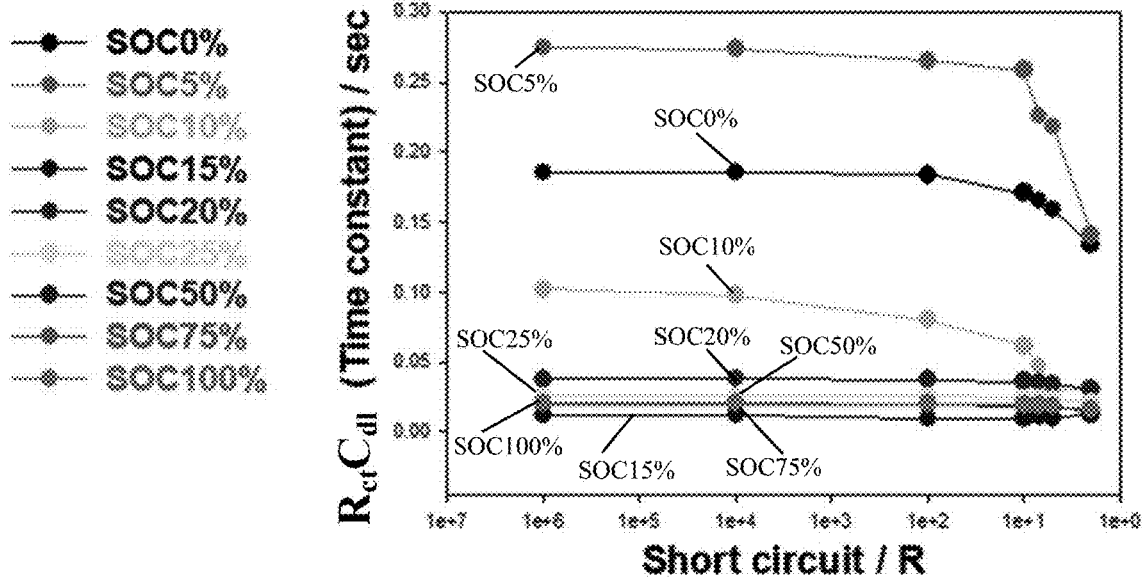
FIG. 15A shows the change of the time constant according to the degree of internal short circuit and the SOC level.
Figure 15B:
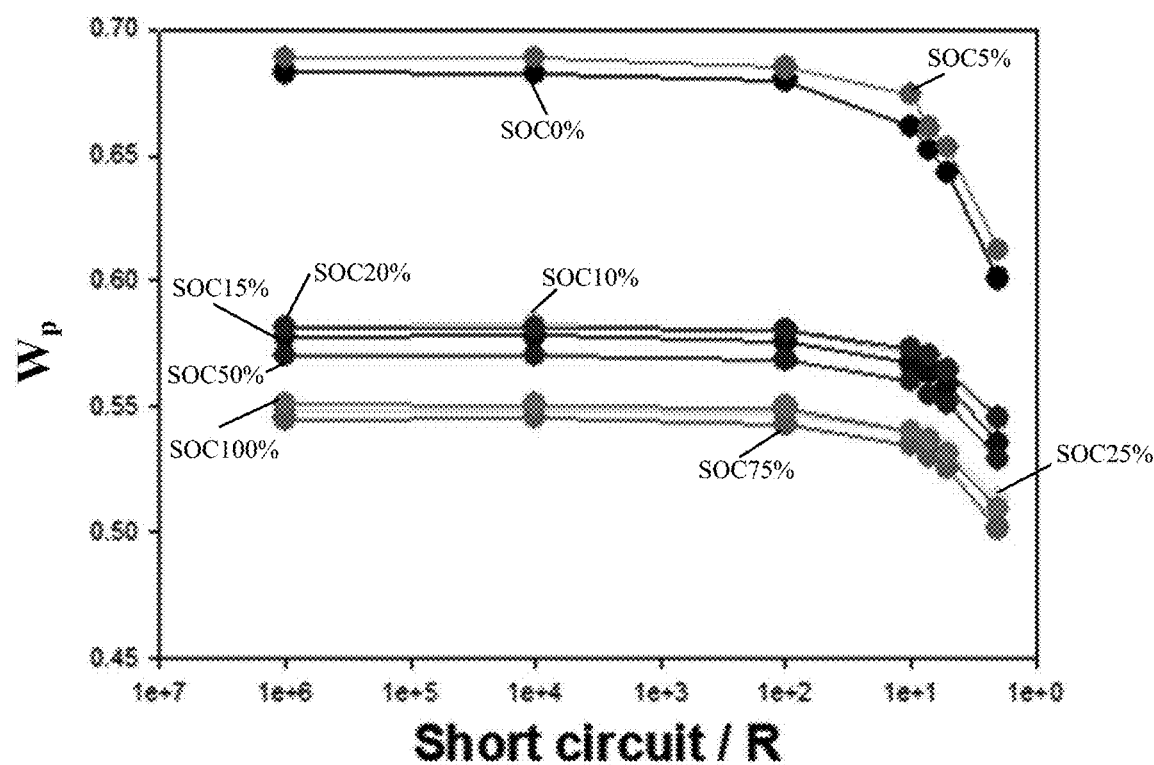
FIG. 15B shows the change of the Warburg index $W_P$ value according to the degree of the internal short circuit and the SOC level.
Figure 16:
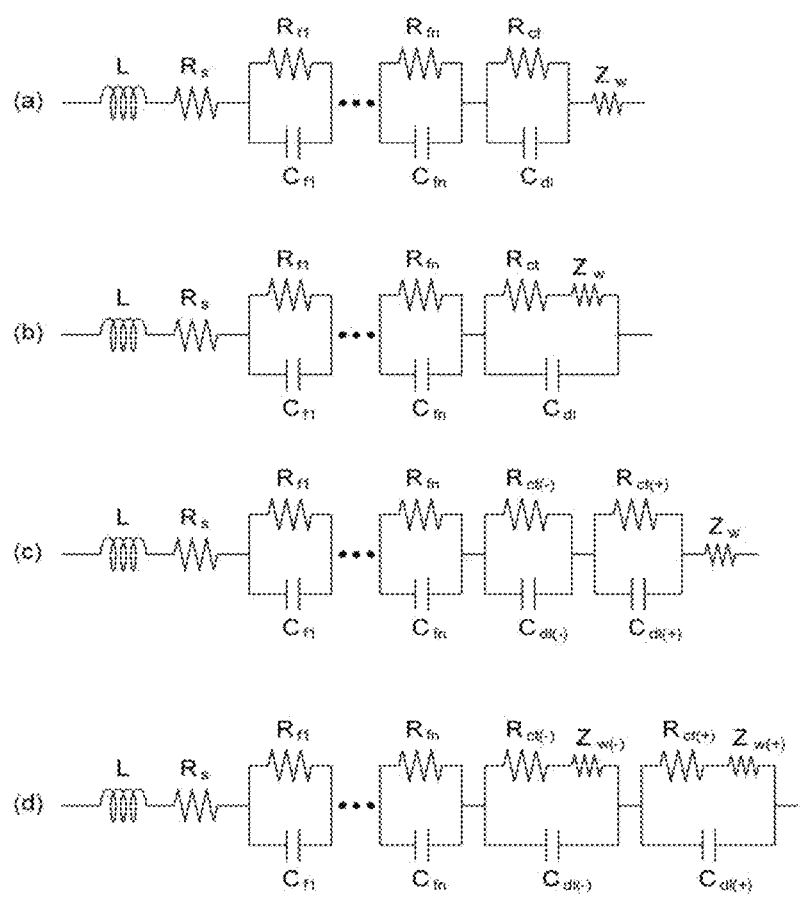
FIG. 16 shows four examples of an equivalent circuit model based on a Nyquist plot.

FIG. 16 shows four examples (a) through (d) of an equivalent circuit model based on a Nyquist plot, such as the Nyquist plot of FIG. 14. In FIG. 16, the following symbols are used:

L is an inductance,
$R_S$ is a resistance of a rechargeable battery electrolyte,
$R_{f1}$ is a film resistance for an RC parallel circuit 1,
$C_{f1}$ is a film capacitance for the RC parallel circuit 1,
$R_{fn}$ is a film resistance for an RC parallel circuit n,
$C_{fn}$ is a film capacitance for the RC parallel circuit n,
$R_{ct}$ is a charge transfer resistance,
$C_{dl}$ is an electric double layer capacitance,
$Z_w$ is a Warburg impedance,
$R_{ct(+)}$ is a charge transfer resistance for a cathode portion,
$C_{dl(+)}$ is an electric double layer capacitance for the cathode portion,
$R_{ct(-)}$ is a charge transfer resistance for an anode portion,
$C_{dl(-)}$ is a an electric double layer capacitance for the anode portion,
$Z_{w(+)}$ is a Warburg impedance for the cathode portion,
$Z_{w(-)}$ is a Warburg impedance for the anode portion, and n is an integer of 1 to 4.

Figure 17:
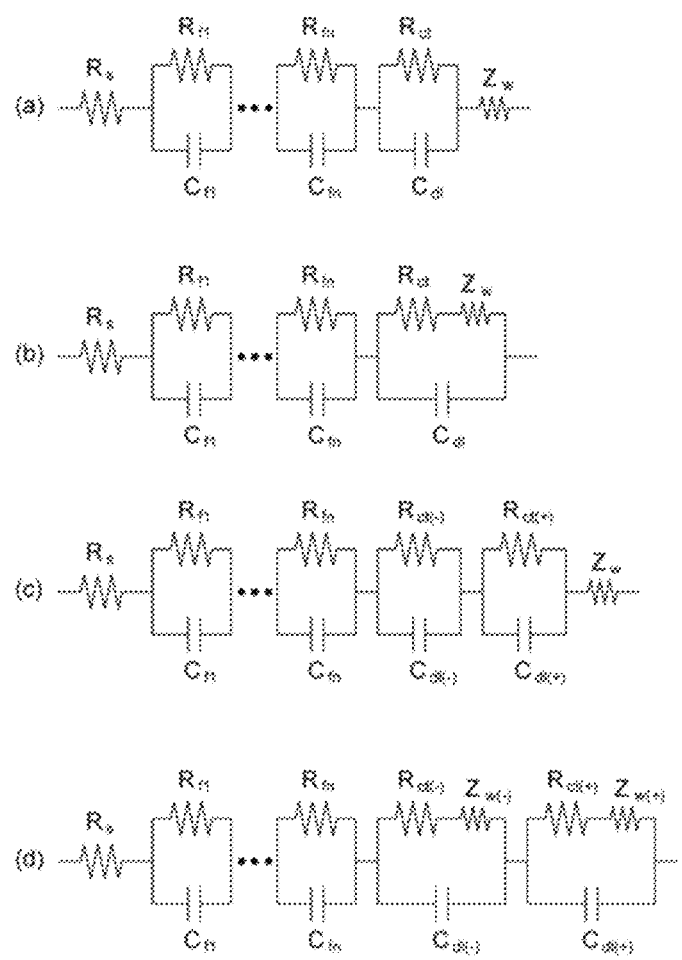
FIG. 17 shows four additional examples of an equivalent circuit model based on a Nyquist plot.

FIG. 17 shows four additional examples of an equivalent circuit model based on a Nyquist plot. The examples of FIG. 17 are the same as examples (a) through (d) of FIG. 16 except that the inductance L is omitted from each.

The method according to the present disclosure may be implemented as a software program including instructions stored in a computer-readable storage medium. The computer is a device capable of calling a stored instruction from a storage medium and operating according to the disclosed embodiment based on the called instruction. The computer may include the electronic device according to the disclosed embodiment.

The method according to the present disclosure may be installed in an apparatus for analyzing a rechargeable battery. Specifically, the method according to the present disclosure may be implemented and used in a charging/discharging apparatus that repeats charging and discharging of a rechargeable battery to test the life of the rechargeable battery.

In addition, the method according to the present disclosure may be used in an apparatus for manufacturing a rechargeable battery. In general, the rechargeable battery is manufactured through an electrode process, an assembly process, and an activation process, and the method of the present disclosure can be used to detect defects in the rechargeable battery in the activation process.

The method according to the present disclosure may also be implemented in the form of a recording medium including instructions executable by a computer, such as a program module to be executed by a computer. The computer-readable medium may be any available medium that can be accessed by a computer and includes volatile and nonvolatile mediums, and removable and non-removable mediums. Further, the computer-readable medium may include a computer storage medium. The computer storage medium includes volatile and nonvolatile mediums, and removable and non-removable mediums implemented in any method or technology for storage of information such as computer-readable instructions, data structures, program modules or other data.

In addition, the method according to the present disclosure may be provided by being included in a computer program product. The computer program product may be traded between a seller and a buyer as goods.

The above description of the present disclosure is for illustration, and those of ordinary skill in the art to which the present disclosure pertains may understand that it can be easily modified into other specific forms without changing the technical spirit or essential features of the present disclosure. Therefore, it should be understood that the embodiments described above are illustrative in all respects and not restrictive. For example, each component described as a single type may be implemented in a dispersed form, and likewise components described as distributed may be implemented in a combined form.

The scope of the present disclosure is indicated by the following claims rather than the above detailed description, and all changes or modifications derived from the meaning and scope of the claims and their equivalents should be construed as being included in the scope of the present disclosure.

What is claimed is:

1. A method of detecting a defect in a rechargeable battery using an AC impedance, the method comprising:
   measuring an output signal by applying an input signal to a rechargeable battery while modulating a frequency, and calculating an AC impedance according to a frequency from the input signal and the output signal;
   Nyquist plotting the calculated AC impedance, and building an equivalent circuit model based on the Nyquist plot;
   calculating a product of a charge transfer resistance component and an electric double layer capacitance component in the equivalent circuit model as a time constant;
   comparing the time constant with a predetermined time constant; and
   determining the rechargeable battery as defective when the time constant is less than the predetermined time constant.

2. The method of claim 1, wherein the calculating of the AC impedance includes:
   using an AC voltage as the input signal and measuring an AC current as the output signal; and
   calculating the AC impedance by dividing the input signal by the output signal.

3. The method of claim 1, wherein the calculating of the AC impedance includes:
   using an AC current as the input signal and measuring an AC voltage as the output signal; and
   calculating the AC impedance by dividing the output signal by the input signal.

4. The method of claim 1, wherein the equivalent circuit model is one of the following (a) to (d):
   (a) connected in series, an inductance, a resistance of a rechargeable battery electrolyte, a series of n RC parallel circuits, each including a film resistance and a film capacitance, and wherein n is an integer of 1 to 4, an RC parallel circuit including a charge transfer resistance and an electric double layer capacitance, and a Warburg impedance;
   (b) connected in series, the inductance, the resistance of a rechargeable battery electrolyte, the series of n RC parallel circuits, and an RC parallel circuit including the electric double layer capacitance and including the charge transfer resistance in series with the Warburg impedance;
   (c) connected in series, the inductance, the resistance of a rechargeable battery electrolyte, the series of n RC parallel circuits, an RC parallel circuit including a charge transfer resistance for a cathode portion and including an electric double layer capacitance for the cathode portion, and an RC parallel circuit including a charge transfer resistance for an anode portion and including an electric double layer capacitance for the anode portion, and a Warburg impedance, or
   (d) connected in series, the inductance, the resistance of a rechargeable battery electrolyte, the series of n RC parallel circuits, an RC parallel circuit including the charge transfer resistance for the cathode portion in series with a Warburg impedance for the cathode portion and including the electric double layer capacitance for the cathode portion, and an RC parallel circuit including the charge transfer resistance for the anode portion in series with a Warburg impedance for the anode portion and including the electric double layer capacitance for the anode portion.

5. The method of claim 1, wherein the equivalent circuit model is one of the following (a) to (d):
   (a) connected in series, a resistance of a rechargeable battery electrolyte, a series of n RC parallel circuits, each including a film resistance and a film capacitance, and wherein n is an integer of 1 to 4, an RC parallel circuit including a charge transfer resistance and an electric double layer capacitance, and a Warburg impedance;

(b) connected in series, the resistance of a rechargeable battery electrolyte, the series of n RC parallel circuits, and an RC parallel circuit including the electric double layer capacitance and including the charge transfer resistance in series with the Warburg impedance;

(c) connected in series, the resistance of a rechargeable battery electrolyte, the series of n RC parallel circuits, an RC parallel circuit including a charge transfer resistance for a cathode portion and including an electric double layer capacitance for the cathode portion, and an RC parallel circuit including a charge transfer resistance for an anode portion and including an electric double layer capacitance for the anode portion, and a Warburg impedance, or (d) connected in series, the resistance of a rechargeable battery electrolyte, the series of n RC parallel circuits, an RC parallel circuit including the charge transfer resistance for the cathode portion in series with a Warburg impedance for the cathode portion and including the electric double layer capacitance for the cathode portion, and an RC parallel circuit including the charge transfer resistance for the anode portion in series with a Warburg impedance for the anode portion and including the electric double layer capacitance for the anode portion.

6. The method of claim 1, wherein in the calculating of the AC impedance, an upper limit of a frequency modulation range of the input signal applied to the rechargeable battery is 10 Hz to 100 MHz, and a lower limit of the frequency modulation range is 0.05 Hz to 0.001 Hz.

7. The method of claim 6, wherein the frequency modulation range of the input signal applied to the rechargeable battery includes a range of 0.05 Hz to 1 Hz.

8. The method of claim 1, wherein the calculating of the AC impedance is performed in a range of state-of-charge of 0% to 20%.

9. The method of claim 1, wherein in the calculating of the AC impedance, the output signal is an open circuit voltage between 3.0 V and 3.55 V, inclusive.

10. The method of claim 1, wherein defects of the rechargeable battery include one or more of an internal short circuit due to metallic impurities mixed into a cathode material, an internal short circuit due to presence or particle separation of coarse particles in a cathode, an internal short circuit due to misalignment of an assembly position of a separator, folding of the separator, or pinholes in the separator, and an internal short circuit due to dendrites caused by lithium electrodeposition.

11. The method of claim 1, wherein the predetermined time constant is determined by performing, on a standard rechargeable battery of the same standard as the rechargeable battery for which defects are to be detected, the steps of:

measuring an output signal by applying an input signal to the standard rechargeable battery while modulating a frequency, and calculating an AC impedance according to a frequency from the input signal and the output signal;

Nyquist plotting the calculated AC impedance, and building an equivalent circuit model based on the Nyquist plot; and calculating the product of a charge transfer resistance component R and an electric double layer capacitance component in the equivalent circuit model as the predetermined time constant.

12. The method of claim 1, further comprising:

calculating a slope of a straight line appearing in a low-frequency region in the Nyquist plot;

comparing an absolute value of the calculated slope of the straight line with a predetermined slope absolute value; and determining the rechargeable battery as defective when the absolute value of the calculated slope of the straight line is smaller than the predetermined slope absolute value.

* * * * *